(12) United States Patent
Chun et al.

(10) Patent No.: US 12,101,880 B2
(45) Date of Patent: Sep. 24, 2024

(54) PRINTED CIRCUIT BOARD

(71) Applicant: SAMSUNG ELECTRO-MECHANICS CO., LTD., Suwon-si (KR)

(72) Inventors: Hee-Joon Chun, Suwon-si (KR); Jae Sung Sim, Suwon-si (KR); Hak Young Lee, Suwon-si (KR); Kwang Hee Kwon, Suwon-si (KR); Hee Jung Jung, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 143 days.

(21) Appl. No.: 17/688,219

(22) Filed: Mar. 7, 2022

(65) Prior Publication Data
US 2022/0408559 A1 Dec. 22, 2022

(30) Foreign Application Priority Data
Jun. 16, 2021 (KR) .......................... 10-2021-0077836

(51) Int. Cl.
*H05K 1/09* (2006.01)
*H05K 1/11* (2006.01)
(Continued)

(52) U.S. Cl.
CPC ............. *H05K 1/092* (2013.01); *H05K 1/115* (2013.01); *H05K 3/0044* (2013.01); *H05K 3/422* (2013.01);
(Continued)

(58) Field of Classification Search
None
See application file for complete search history.

(56) References Cited

U.S. PATENT DOCUMENTS

| | | | |
|---|---|---|---|
| 11,183,462 B2 * | 11/2021 | Hwang | ............... H01L 23/5386 |
| 2004/0115340 A1 * | 6/2004 | Griego | .................... H01L 24/13 430/315 |

(Continued)

FOREIGN PATENT DOCUMENTS

| | | | |
|---|---|---|---|
| CN | 110691460 A * | 1/2020 | ............... H05K 1/09 |
| KR | 10-0622320 B1 | 9/2006 | |

(Continued)

OTHER PUBLICATIONS

CN 110691460 A Translation (Year: 2023).*

(Continued)

*Primary Examiner* — Timothy J Thompson
*Assistant Examiner* — John B Freal
(74) *Attorney, Agent, or Firm* — MORGAN, LEWIS & BOCKIUS LLP

(57) ABSTRACT

A printed circuit board includes: a first insulating layer; a first metal layer disposed on one surface of the first insulating layer; a second metal layer disposed on the other surface facing the one surface of the first insulating layer; a via penetrating through the first insulating layer to connect the first and second metal layers to each other; and a heterogeneous metal region disposed in at least one of an area in which the via is adjacent to the first insulating layer and an area in which the via is adjacent to the first metal layer, and including a material different from that of the via, wherein the heterogeneous metal region includes at least one of nickel (Ni), silicon (Si), and titanium (Ti).

16 Claims, 5 Drawing Sheets

(51) Int. Cl.
*H05K 3/00* (2006.01)
*H05K 3/42* (2006.01)

(52) U.S. Cl.
CPC ............ *H05K 3/423* (2013.01); *H05K 3/429* (2013.01); *H05K 2201/0391* (2013.01); *H05K 2201/09563* (2013.01); *H05K 2203/025* (2013.01)

(56) References Cited

U.S. PATENT DOCUMENTS

| | | |
|---|---|---|
| 2007/0141759 A1 | 6/2007 | Nagase et al. |
| 2016/0057866 A1* | 2/2016 | Shimoda ................ C09D 11/38 257/532 |
| 2020/0163228 A1 | 5/2020 | Lee et al. |
| 2020/0273763 A1* | 8/2020 | Tsuchida .................. H05K 3/46 |

FOREIGN PATENT DOCUMENTS

| | | |
|---|---|---|
| KR | 10-1346913 B1 | 1/2014 |
| KR | 10-2020-0004596 A | 1/2020 |
| KR | 10-2020-0056833 A | 5/2020 |

OTHER PUBLICATIONS

Eungyeong Lee, et al., "Tensile and Electrical Properties of Direct Aged Cu—Ni—Si—x%Ti Alloys", Met. Mater. Int., vol. 19, No. 2 (2013), pp. 183-188.

* cited by examiner

PRINTED CIRCUIT BOARD

CROSS-REFERENCE TO RELATED APPLICATION(S)

This application claims benefit of priority to Korean Patent Application No. 10-2021-0077836 filed on Jun. 16, 2021 in the Korean Intellectual Property Office, the disclosure of which is incorporated herein by reference in its entirety.

TECHNICAL FIELD

The present disclosure relates to a printed circuit board.

BACKGROUND

In order to follow the recent trend in mobile devices towards weight and size reductions, there has also been a growing need for making printed circuit boards to be mounted thereon lighter, thinner, shorter, and smaller.

Accordingly, in order to form micro-vias connecting layers to each other in the printed circuit boards, techniques for efficiently processing micro-via holes are required. In addition, it is required that the wiring materials filling the micro-via holes have excellent electrical and mechanical properties.

SUMMARY

An aspect of the present disclosure may provide a printed circuit board including a microcircuit and/or a micro-via.

Another aspect of the present disclosure may provide a printed circuit board in which a via of a micro circuit having excellent electrical and mechanical properties is formed.

According to an aspect of the present disclosure, a printed circuit board may include: a first insulating layer; a first metal layer disposed on one surface of the first insulating layer; a second metal layer disposed on the other surface facing the one surface of the first insulating layer; a via penetrating through the first insulating layer to connect the first and second metal layers to each other; and a heterogeneous metal region disposed in at least one of an area in which the via is adjacent to the first insulating layer and an area in which the via is adjacent to the first metal layer, and including a material different from that of the via, wherein the heterogeneous metal region includes at least one of nickel (Ni), silicon (Si), and titanium (Ti).

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Electronic Device

Figure 1:
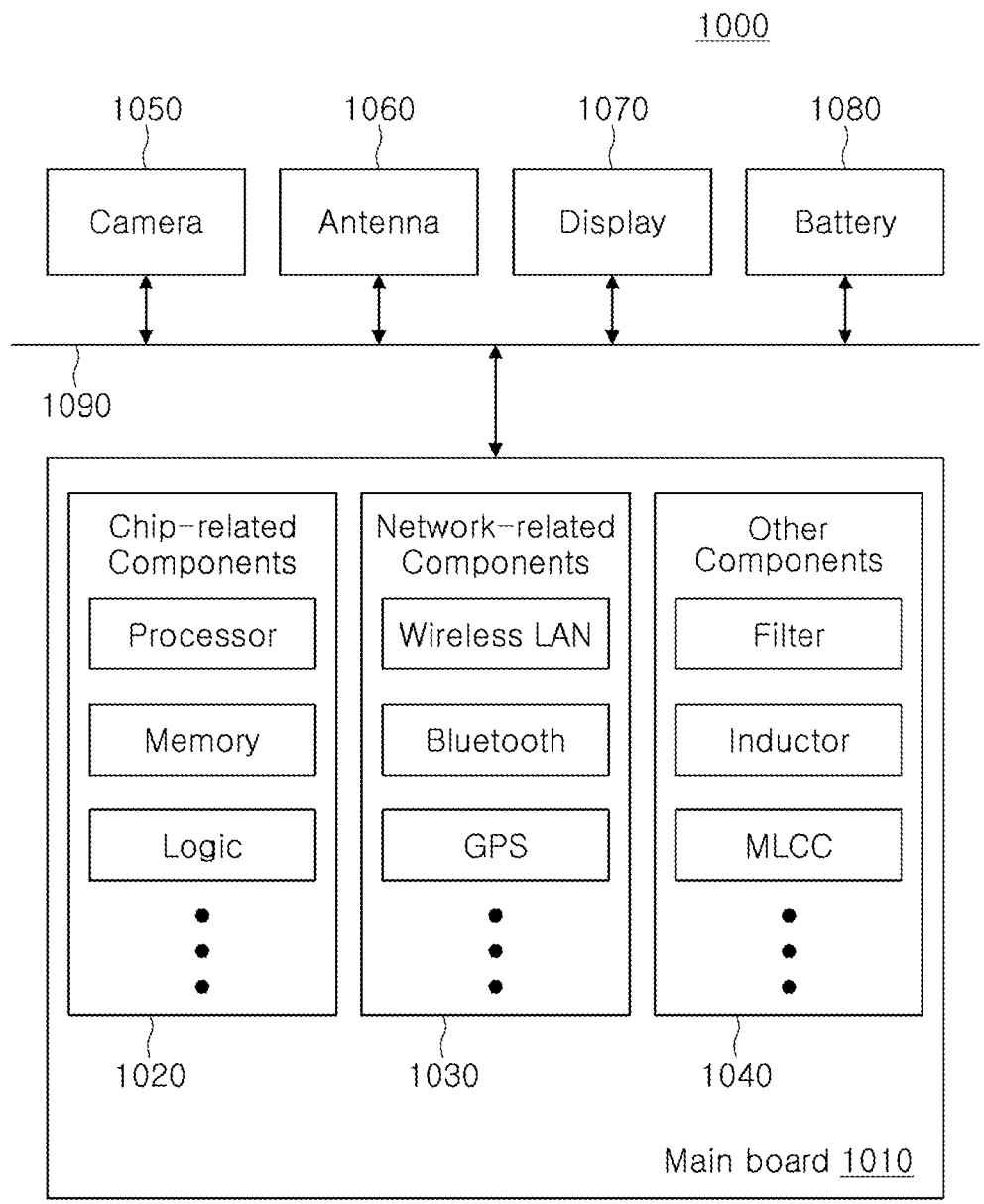
FIG. 1 is a diagram schematically illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, these electronic components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+(HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related electronic components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related electronic components 1020 and/or the network-related electronic components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
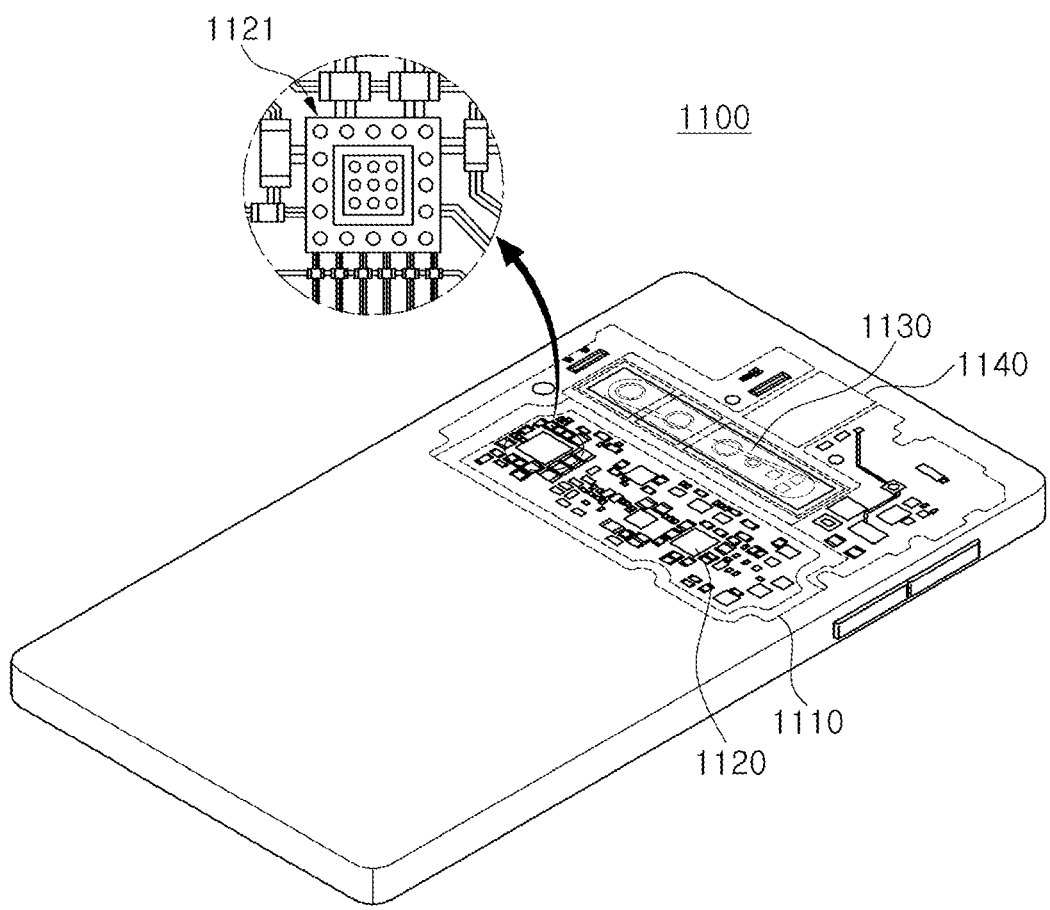
FIG. 2 is a diagram schematically illustrating an exemplary embodiment of an electronic device.

FIG. 2 is a perspective view schematically illustrating an exemplary embodiment of an electronic device.

Referring to FIG. 2, the electronic device may be, for example, a smartphone 1100. A mainboard 1110 may be accommodated in the smartphone 1100, and various electronic components 1120 may be physically and/or electrically connected to the mainboard 1110. In addition, other electronic components that may or may not be physically and/or electrically connected to the mainboard 1110, such as a camera module 1130 and/or a speaker 1140, may also be accommodated therein. Some of the electronic components 1120 may be the above-described chip-related components, e.g., an antenna module 1121, but are not limited thereto. The antenna module 1121 may be in such a form that the electronic component is surface-mounted on a printed circuit board, but is not limited thereto. Meanwhile, the electronic device is not necessarily limited to the smartphone 1100, but may be any other electronic device as described above.

Printed Circuit Board

Figure 3:
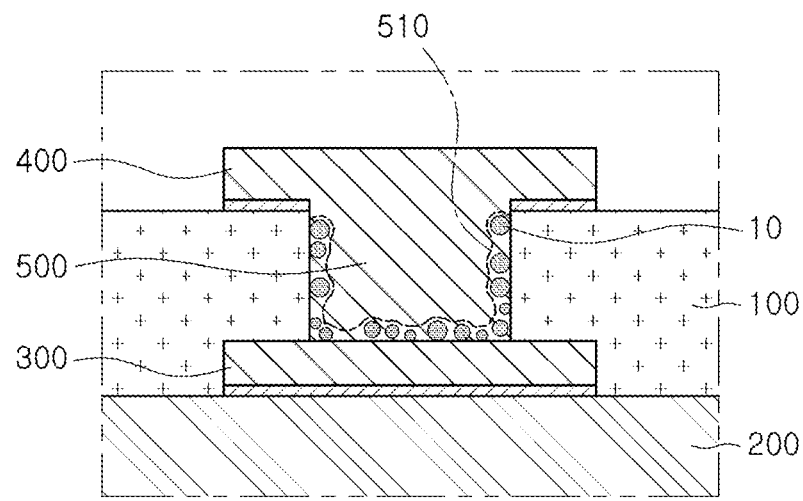
FIG. 3 is a diagram schematically illustrating an exemplary embodiment of a printed circuit board according to the present disclosure.

FIG. 3 is a diagram schematically illustrating an exemplary embodiment of a printed circuit board according to the present disclosure.

Referring to FIG. 3, the printed circuit board according to the present disclosure may include a first insulating layer 100, a first metal layer 300 disposed on one surface of the first insulating layer 100, a second metal layer 400 disposed on the other surface facing the one surface of the first insulating layer 100, and a via 500 penetrating through the first insulating layer 100 to connect the first and second metal layers 300 and 400 to each other.

In this case, the printed circuit board according to the present disclosure may further include a heterogeneous metal region 510 disposed in at least one of an area in which the via 500 is adjacent to the first insulating layer 100 and an area in which the via is adjacent to the first metal layer 300, and including a material different from that of the via.

In this case, the heterogeneous metal region 510 may include at least one of nickel (Ni), silicon (Si), and titanium (Ti). By disposing the heterogeneous metal region 510 including the aforementioned metal materials, which have high electrical conductivity, between the via 500 and the first metal layer 300, electrical conductivity can be improved, and mechanical strength can also be improved.

The heterogeneous metal region 510 may include at least one particle. More specifically, the heterogeneous metal region 510 may include a conductive material in the form of particle including at least one of nickel (Ni), silicon (Si), and titanium (Ti), but is not limited thereto.

The heterogeneous metal region 510 may be a layer formed in a plating process for filling a via hole 500H after the via hole 500H is formed. More specifically, as will be described below, the via hole 500H may be formed through a blasting processing method using a metal abrasive 10, and the metal abrasive 10 remaining in the via hole 500H after the via hole 500H is formed may be combined with a plating layer for forming the via 500, as a result forming the heterogeneous metal region 510. In this case, the metal abrasive 10 remaining in the via hole 500H may include at least one of nickel (Ni), silicon (Si), and titanium (Ti), and the heterogeneous metal region 510 formed by the combination of the metal abrasive 10 remaining in the via hole 500H with the plating layer may include a material different from that of the via 500. In addition, the plating layer forming the via 500 by filling the via hole 500H may include an electroless plating layer and an electrolytic plating layer. The heterogeneous metal region 510 may contact with the electroless plating layer, or may contact both the electroless plating layer and the electrolytic plating layer, but is not limited thereto.

Since the heterogeneous metal region 510 including the aforementioned metal materials, which have high electrical conductivity, connects the via 500 and the first metal layer 300 to each other, electrical conductivity can be improved, and mechanical strength can also be improved.

The heterogeneous metal region 510 may be formed only in an area in which the via 500 is adjacent to each of the first insulating layer 100 and the first metal layer 300. More specifically, the via hole 500H may have a first area 500A adjacent to the first metal layer 300 and a second area 500B adjacent to the first insulating layer 100, and in this case, the heterogeneous metal region 510 may be disposed in at least portions of the first and second areas 500A and 500B. This is because the metal abrasive used in the blasting process at the time of forming the via hole 500H may remain only in an area adjacent to each of the first insulating layer 100 and the first metal layer 300 of the via hole 500H. Alternatively, the heterogeneous metal region 510 may be disposed only in the first area 500A, where the via 500 is adjacent to the first metal layer 300, but is not limited thereto.

In this case, the metal abrasive used in the blasting process may include at least one of nickel (Ni), silicon (Si), and titanium (Ti), and the metal abrasive 10 may have a particle size of 0.001 to 50 μm, and may be dispersed in irregular particle sizes. The particle size of the metal abrasive 10 may be measured by a known technique. For example, the particle size may be measured with a scanning electron microscope (SEM).

Since copper (Cu) input in the plating process for forming the via 500 and at least one of nickel (Ni), silicon (Si), and titanium (Ti) remaining after the blasting process for forming the via hole 500H form the heterogeneous metal region 510, electrical conductivity can be improved, and mechanical strength can also be improved, but the effects are not limited thereto.

The heterogeneous metal region 510 may include 3 to 7 wt % of nickel (Ni), silicon (Si), and titanium (Ti) based on, for example, a total weight of copper (Cu), nickel (Ni), silicon (Si), and titanium (Ti) in the heterogenous metal region 510. In this case, when nickel (Ni), silicon (Si), and titanium (Ti) are included in the heterogeneous metal region 510 in an amount of less than 3 wt %, it is not possible to expect the improvement in mechanical strength of the heterogeneous metal region compared to the via plating layer including only Cu according to the present disclosure. On the other hand, when nickel (Ni), silicon (Si), and titanium (Ti) are included in the heterogeneous metal region 510 in an amount of more than 7 wt %, the thermal conductivity and electrical conductivity of the heterogeneous metal region may be greatly lower than those of the via plating layer including only Cu. Considering all of the mechanical strength, electrical conductivity, or the like of the circuit pattern and the via 500, the amount of nickel (Ni), silicon (Si), and titanium (Ti) included in the heterogeneous metal region 510 is preferably maintained in the range of 3 to 7 wt %, but is not limited thereto.

A method of measuring weights of nickel (Ni), silicon (Si), and titanium (Ti) in the heterogeneous metal region 510 or a content ratio therebetween will be described below.

A part of the conductive material included in the heterogeneous metal region 510 may be extracted from an area in which the via 500 is adjacent to each of the first metal layer 300 and the first insulating layer 100. In this case, if necessary, the board may be cut at an arbitrary point thereof to expose a portion of the via 500 or the heterogeneous metal region 510, but the extraction is not limited thereto. In addition, the conductive material may be extracted from the heterogeneous metal region 510 multiple times. In addition, the conductive material may be extracted only from the first area 500A, where the via 500 is adjacent to the first metal layer 300, or may be extracted only from the second area 500B, where the via 500 is adjacent to the first insulating layer 100, but the extraction is not limited thereto.

Here, the area in which the via 500 is adjacent to each of the first metal layer 300 and the first insulating layer 100 may include an area from a portion of the via 500 completely contacting each of the first metal layer 300 and the first insulating layer 100 to a portion of the via 500 spaced apart from each of the first metal layer 300 and the first insulating layer 100 by a predetermined distance, excluding a portion of the via 500 spaced apart from the first insulating layer 100 by more than a predetermined distance. The predetermined distance is not limited, but may refer to a length or a shortest distance of an area including at least one of nickel (Ni), silicon (Si), and titanium (Ti) of the via 500.

Thereafter, relative mass fractions of copper (Cu), nickel (Ni), silicon (Si), and titanium (Ti) in the extracted conductive sample may be seen through energy dispersive X-ray spectroscopy or inductively coupled plasma mass spectroscopy. Based thereon, a content ratio between nickel (Ni), silicon (Si), and titanium (Ti) may be found.

In addition, when the conductive material is extracted multiple times, a plurality of measurement values for a total weight of the conductive material may be obtained. Also, a plurality of values for a sum of respective weights of nickel (Ni), silicon (Si), and titanium (Ti) may be obtained. In this case, each of nickel (Ni), silicon (Si), and titanium (Ti) contents of the heterogeneous metal region 510 may be an average value of measurement values for respective samples of the conductive material extracted multiple times. More specifically, in a case in which the conductive material is extracted multiple times, a weight ratio or a content ratio between nickel (Ni), silicon (Si), and titanium (Ti) may be measured for each of a plurality of samples of the extracted conductive material, and an arithmetical average value of the measurement values may be a weight ratio or a content ratio between nickel (Ni), silicon (Si), and titanium (Ti) included in the heterogeneous metal region 510.

In addition, the printed circuit board according to the present disclosure may further include a second insulating layer 200 disposed on one surface of the first insulating layer 100 and at least partially contacting the first metal layer 300. That is, the printed circuit board according to the present disclosure may include a first insulating layer 100 stacked on an upper surface of the second insulating layer 200, and a first metal layer 300 contacting the second insulating layer 200 and embedded in the first insulating layer 100. In this case, the first metal layer 300 may be embedded in one surface of the first insulating layer 100 and protrude from one surface of the second insulating layer 200. The second metal layer 400 may be formed to protrude from the other surface facing the one surface of the first insulating layer 100.

The first and second insulating layers 100 and 200 may include the same material, or may include different materials. In addition, the first and second insulating layers 100 and 200 may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

The second insulating layer 200 may be a carrier film. In this case, the carrier film may include a copper clad laminate (CCL). Types of copper clad laminates may include glass/epoxy copper clad laminates, heat-resistant resin copper clad laminates, paper/phenolic copper clad laminates, high-frequency copper clad laminates, flexible copper clad laminates, composite copper clad laminates, or the like, based on purposes of use. In this case, the copper foil may include copper (Cu), and may be removed in the process of forming the first metal layer 300 except for a portion on which the first metal layer 300 is formed.

The first insulating layer 100 may be an insulating layer onto which a carrier copper foil is attached. Like the carrier copper foil of the second insulating layer 200, the carrier copper foil of the first insulating layer 100 may be removed in the process of forming the second metal layer 400 except for a portion where the second metal layer 400 is formed.

The via 500 and the first and second metal layers 300 and 400 may be formed by using a conductive material such as copper (Cu), aluminum (Al), silver (Ag), tin (Sn), gold (Au), nickel (Ni), lead (Pb), titanium (Ti), palladium (Pd), or alloys thereof, or by using a non-insulating material such as a carbon fiber as well as a metal material. The electroless plating layer and the electrolytic plating layer of the via 500 filling the via hole 500H may also include copper (Cu), aluminum (Al), silver (Ag), tin (Sn), gold (Au), nickel (Ni), lead (Pb), titanium (Ti), palladium (Pd), or alloys thereof. In this case, the heterogeneous metal region 510 connecting the via 500 and the first metal layer 300 to each other may include at least one of nickel (Ni), silicon (Si), and titanium (Ti).

The heterogeneous metal region 510 may include at least one particle. More specifically, the heterogeneous metal region 510 may include a conductive material in the form of particle including at least one of nickel (Ni), silicon (Si), and titanium (Ti), but is not limited thereto.

The via and the first and second metal layers 300 and 400 may be formed of the same material, but may include different materials. After the first and second metal layers 300 and 400 are formed, the carrier copper foils formed on the first and second insulating layers 100 and 200 may be removed by etching or the like.

Each of the first and second metal layers 300 and 400 may be formed by disposing a plating resist on an upper surface of the copper foil, performing an electrolytic plating process or the like, and then removing the plating resist. The plating resist may be removed by a commonly-used plating resist removing method.

Concerning the other components, what has been described above is substantially identically applicable, and thus, the description thereof will not be repeated.

Method for Manufacturing Printed Circuit Board

FIGS. 4 to 7 are diagrams schematically illustrating processes for manufacturing a printed circuit board according to the present disclosure.

Figure 4:
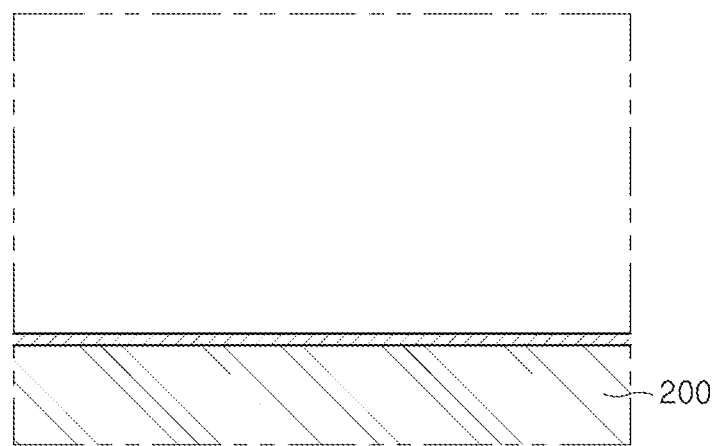
FIGS. 4 to 7 are diagrams schematically illustrating processes for manufacturing a printed circuit board according to the present disclosure.

Referring to FIG. 4, a second insulating layer 200 onto which a copper foil is attached may be prepared. In this case, the second insulating layer may be a carrier film, and may include a copper clad laminate (CCL). Types of copper clad laminates may include glass/epoxy copper clad laminates, heat-resistant resin copper clad laminates, paper/phenolic copper clad laminates, high-frequency copper clad laminates, flexible copper clad laminates, composite copper clad laminates, or the like, based on purposes of use. In this case, the copper foil may include copper (Cu).

Figure 5:
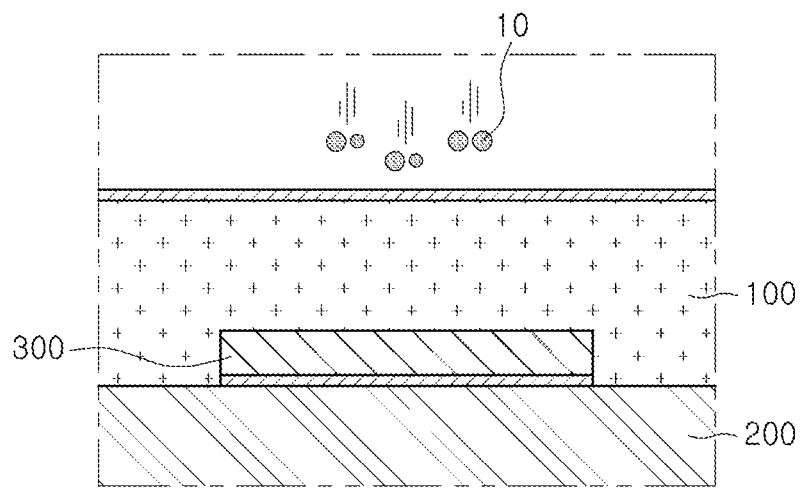

Thereafter, referring to FIG. 5, a first metal layer 300 may be formed, and a first insulating layer 100 embedding the first metal layer 300 may be disposed. In this case, the first metal layer 300 may be formed through a known plating process, e.g., an additive process (AP), a semi additive process (SAP), or a modified semi additive process (MSAP). As another example, the first metal layer 300 may be formed through a subtractive process such as tenting.

In this case, the copper foil attached to the second insulating layer 200 may be removed through an etching process or the like, except for a portion contacting the first metal layer 300. That is, the first metal layer 300 may include a plating layer together with the copper foil attached to the second insulating layer 200.

The first insulating layer 100 stacked on one surface of the second insulating layer 200 may also include a copper foil, and the copper foil may include copper (Cu). The first insulating layer 100 may be disposed to completely embed the first metal layer 300.

Thereafter, a via hole 500H penetrating through at least a portion of the first insulating layer 100 and exposing at least a portion of the first metal layer 300 may be formed, and in this case, a blasting processing method may be used. In particular, an abrasive used in the blasting processing method may include a metal abrasive 10, and the metal abrasive 10 may include at least one of nickel (Ni), silicon (Si), and titanium (Ti), but is not limited thereto.

Figure 6:
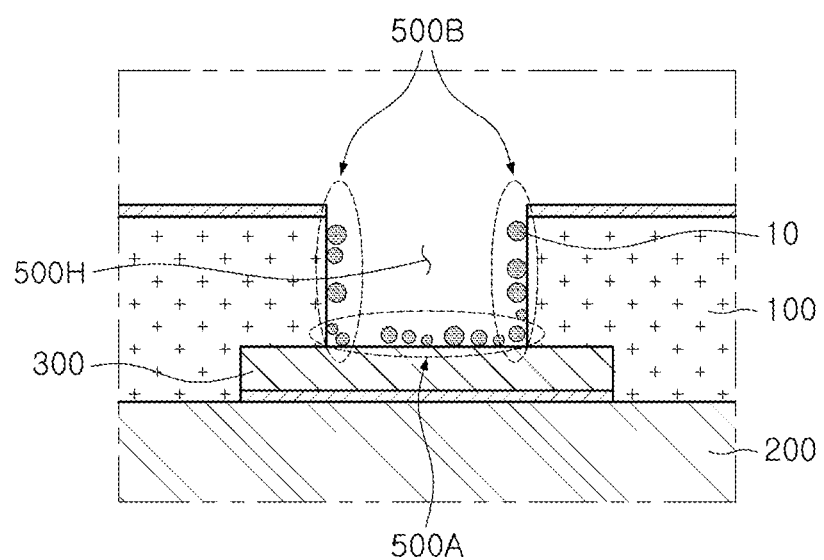

Referring to FIG. 6, the metal abrasive 10 including at least one of nickel (Ni), silicon (Si), and titanium (Ti) used in the blasting process may remain even after the via hole 500H is formed. In particular, the metal abrasive 10 including at least one of nickel (Ni), silicon (Si), and titanium (Ti) may remain in the first area 500A adjacent to the first metal layer 300 and the second area 500B adjacent to the first insulating layer 100 of the via hole 500H.

The metal abrasive 10 used in the blasting process may remain in at least portions of the first and second areas 500A and 500B. In addition, the metal abrasive 10 may include at least one of nickel (Ni), silicon (Si), and titanium (Ti), and the metal abrasive may have a particle size of 0.001 to 50 μm, and may be dispersed in irregular particle sizes, but is not limited thereto.

Figure 7:
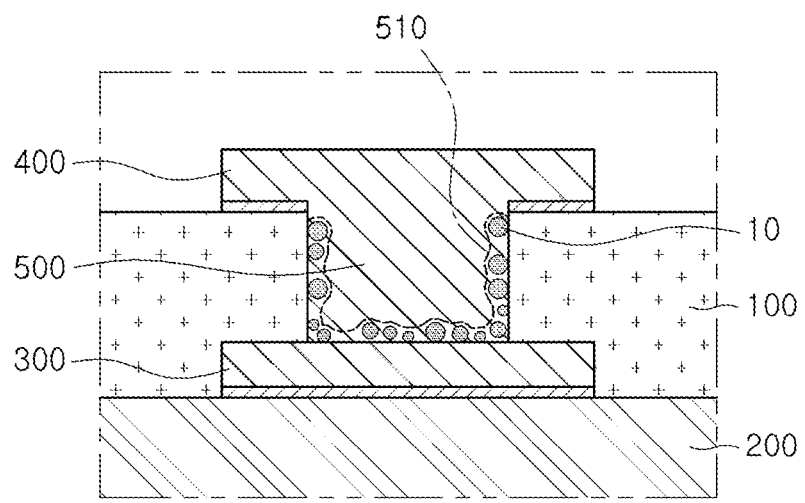

Referring to FIG. 7, a via 500 filling the via hole 500H formed by using the blasting processing method may be formed. In this case, the via 500 may include an electroless plating layer and an electrolytic plating layer. More specifically, an electroless plating layer may be formed on an upper surface of the copper foil attached to the first insulating layer 100 and along the via hole 500H, and an electrolytic plating process may be performed using the electroless plating layer as a seed layer.

In the process of filling the via hole 500H, a region in which the remaining metal abrasive 10 and the plating layer are alloyed with each other, that is, the heterogeneous metal region 510, may be formed. In this case, the metal abrasive 10 remaining in the via hole 500H after the blasting process may include at least one of nickel (Ni), silicon (Si), and titanium (Ti), and the remaining metal abrasive 10 may be combined with the plating layer for forming the via 500, as a result forming the heterogeneous metal region 510. The presence of the alloy may be observed by x-ray diffraction (XRD), for example, by a shift of 1-2° in at least one XRD peaks corresponding to copper (Cu).

The heterogeneous metal region 510 may include at least one particle. More specifically, the heterogeneous metal region 510 may include a conductive material in the form of particle including at least one of nickel (Ni), silicon (Si), and titanium (Ti), but is not limited thereto.

In this case, the heterogeneous metal region 510 formed by the combination with the metal abrasive 10 may contact only the electroless plating layer formed to fill the via hole 500H, or may contact both the electroless plating layer and the electrolytic plating layer although not illustrated, but is not limited thereto.

In addition, the via hole 500H may include a first area 500A adjacent to the first metal layer 300 and a second area 500B adjacent to the first insulating layer 100. The first and second areas 500A and 500B may correspond to an area only within the electroless plating layer of the via 500, or may correspond to an area including both the electroless plating layer and the electrolytic plating layer, but is not limited thereto.

Here, the area in which the via 500 is adjacent to each of the first metal layer 300 and the first insulating layer 100 may include an area from a portion of the via 500 completely contacting each of the first metal layer 300 and the first insulating layer 100 to a portion of the via 500 spaced apart from each of the first metal layer 300 and the first insulating layer 100 by a predetermined distance, excluding a portion of the via 500 spaced apart from the first insulating layer 100 by more than a predetermined distance. The predetermined distance is not limited, but may refer to a length or a shortest distance of an area including at least one of nickel (Ni), silicon (Si), and titanium (Ti) of the via 500.

In this case, the heterogeneous metal region 510 may include 3 to 7 wt % of nickel (Ni), silicon (Si), and titanium (Ti). When nickel (Ni), silicon (Si), and titanium (Ti) are included in the heterogeneous metal region 510 in an amount of less than 3 wt %, mechanical strength may excessively decrease. On the other hand, when nickel (Ni), silicon (Si), and titanium (Ti) are included in the heterogeneous metal region 510 in an amount of more than 7 wt %, thermal conductivity and electrical conductivity may greatly decrease. Considering all of the mechanical strength, electrical conductivity, or the like of the via 500, the amount of nickel (Ni), silicon (Si), and titanium (Ti) included in the heterogeneous metal region 510 is preferably maintained in the range of 3 to 7 wt %, but is not limited thereto.

Since the heterogeneous metal region 510 including at least one of nickel (Ni), silicon (Si), and titanium (Ti) remaining after the blasting process is formed, and the first metal layer 300 and the via 500 are connected to each other by the heterogeneous metal region 510, the via can be formed to have improved electrical conductivity and excellent mechanical strength.

In addition, the second metal layer 400 disposed on the other surface facing the one surface of the first insulating layer 100 may be formed. In this case, the via 500 and the first metal layer 300 may be formed through a known plating process, e.g., an additive process (AP), a semi additive process (SAP), or a modified semi additive process (MSAP). As another example, the via 500 and the first metal layer 300 may be formed through a subtractive process such as tenting.

In this case, the copper foil attached to the first insulating layer 100 may be removed through an etching process or the like, except for a portion contacting the second metal layer 400.

That is, the via 500 may include an electroless plating layer and an electrolytic plating layer, and the second metal layer 400 may include an electroless plating layer and an electrolytic plating layer together with the copper foil attached to the first insulating layer 100.

In particular, each of the first and second metal layers 300 and 400 may be formed by disposing a plating resist on an upper surface of the copper foil, performing an electrolytic plating process or the like, and then removing the plating resist. The plating resist may be removed by a commonly-used plating resist removing method.

Concerning the other components, what has been described above is substantially identically applicable, and thus, the description thereof will not be repeated.

As set forth above, as one effect of the present disclosure, it is possible to provide a printed circuit board including a microcircuit and/or a micro-via.

As another effect of the present disclosure, it is possible to provide a printed circuit board in which a via of a microcircuit having excellent electrical and mechanical properties is formed.

While exemplary embodiments have been shown and described above, it will be apparent to those skilled in the art that modifications and variations could be made without departing from the scope of the present invention as defined by the appended claims.

What is claimed is:

1. A printed circuit board comprising:
    a first insulating layer;
    a first metal layer disposed on one surface of the first insulating layer;
    a second metal layer disposed on an other surface facing the one surface of the first insulating layer;
    a via hole penetrating through the first insulating layer;
    a via disposed in the via hole and penetrating through the first insulating layer to connect the first and second metal layers to each other; and
    a heterogeneous metal region including a material different from that of the via, wherein the heterogeneous metal region is disposed in an area in which the via is adjacent to the first metal layer and on an inner wall of the via hole, where the inner wall is adjacent to the first insulating layer,
    wherein the heterogeneous metal region includes silicon (Si) and either titanium (Ti) or nickel (Ni).

2. The printed circuit board of claim 1, wherein the heterogeneous metal region includes at least one particle.

3. The printed circuit board of claim 1, wherein the heterogeneous metal region further includes copper (Cu).

4. The printed circuit board of claim 3, wherein the heterogeneous metal region includes an alloy including copper and at least one of nickel (Ni), silicon (Si), and titanium (Ti).

5. The printed circuit board of claim 1, wherein the heterogeneous metal region connects the first metal layer and the via to each other.

6. The printed circuit board of claim 1, wherein the heterogeneous metal region includes 3 to 7 wt % of nickel (Ni), silicon (Si), and titanium (Ti).

7. The printed circuit board of claim 1, wherein the first metal layer is embedded in the one surface of the first insulating layer, and
    the second metal layer protrudes from the other surface of the first insulating layer.

8. The printed circuit board of claim 1, further comprising a second insulating layer disposed on the one surface of the first insulating layer and at least partially contacting the first metal layer.

9. The printed circuit board of claim 1, wherein the first and second metal layers include the same metal material.

10. The printed circuit board of claim 1, wherein the via includes an electroless plating layer and an electrolytic plating layer, and
    the heterogeneous metal region contacts at least a portion of the electroless plating layer.

11. The printed circuit board of claim 1, wherein the heterogeneous metal region includes an abrasive.

12. The printed circuit board of claim 11, wherein the abrasive includes nickel (Ni).

13. The printed circuit board of claim 11, wherein the abrasive includes titanium (Ti).

14. The printed circuit board of claim 11, wherein the abrasive includes nickel (Ni), titanium (Ti), and silicon (Si).

15. The printed circuit board of claim 1, further comprising
    a first metal foil between the first insulating layer and the second metal layer; and
    a second metal foil that overlays the first metal layer in a stacking direction of the first and second metal layers and the first insulating layer.

16. The printed circuit board of claim 15, wherein the first metal foil is not the via.

* * * * *